United States Patent [19]
Nojiri et al.

[11] Patent Number: 5,173,149
[45] Date of Patent: Dec. 22, 1992

[54] METHOD OF ETCHING SEMICONDUCTOR SUBSTRATE

[75] Inventors: Hidetoshi Nojiri, Yokosuka; Makoto Uchiyama, Zushi, both of Japan

[73] Assignee: Nissan Motor Company, Ltd., Yokohama, Japan

[21] Appl. No.: 665,546

[22] Filed: Mar. 7, 1991

[30] Foreign Application Priority Data

Mar. 7, 1990 [JP] Japan .................................. 2-55790

[51] Int. Cl.$^5$ .......................................... H01L 21/00
[52] U.S. Cl. .................................. 156/627; 156/626; 156/345; 156/643
[58] Field of Search ............... 156/626, 627, 345, 643; 204/129.2

[56] References Cited

U.S. PATENT DOCUMENTS 4,621,037 11/1986 Kanda et al. ........................ 156/626
4,995,939 2/1991 Ferenczi et al. ..................... 156/627

FOREIGN PATENT DOCUMENTS 2-073634 3/1990 Japan ................................. 156/627

OTHER PUBLICATIONS

"Anodic Dissolution and Selective Etching of Gallium Phosphide"; by Meek et al.; Journal of Elect. Society, 119, No. 9, pp. 1148-1152.

*Primary Examiner*—Brian E. Hearn
*Assistant Examiner*—George Goudreau
*Attorney, Agent, or Firm*—Foley & Lardner

[57] ABSTRACT

To eliminate the influence of fluctuations in etching liquid sorts, composition, density, degradation, temperature, agitation etc., a method of selectively etching a semiconductor substrate having an n-type layer and a p-type layer and immersed in an electrolytic solution comprises the steps of: applying an etching voltage to the n-type layer; integrating etching current flowing through the substrate; if the integrated current value exceeds a reference value required to etch the p-type layer to a predetermined depth, increasing the etching voltage; if the potential of the substrate relative to a reference electrode reaches a predetermined value at which only the p-type layer can be etched, keeping the increased etching voltage at the current level to further etch only the p-type layer; and if the etching current drops sharply due to formation of an anodic oxidation film on the n-type layer, completing the substrate etching.

11 Claims, 14 Drawing Sheets

METHOD OF ETCHING SEMICONDUCTOR SUBSTRATE

BACKGROUND OF THE INVENTION

1. Field of the Invention

The present invention relates to a method of etching a semiconductor substrate and more specifically to a method of stably etching a semiconductor substrate without being subjected to the influence of fluctuations in various etching conditions.

2. Description of the Prior Art

FIG. 1 shows an example of prior-art electrolytic etching apparatus, which comprises an electrolytic bath 1, an etching liquid (electrolytic solution) 2 put in the electrolytic bath 1, a semiconductor substrate 3 such as a silicon substrate, an electrode 4 opposing to the substrate 3, a reference electrode 6 made of silver and/or silver chloride Ag/AgCl, and a variable voltage power supply 5 including a potentiostat. A dc voltage V1 applied between the opposing electrode 4 and the semiconductor substrate 3 is controlled by the variable voltage power supply 5, so that a potential V2 of the semiconductor substrate 3 relative to the reference electrode 6 can be maintained at a predetermined value.

A method of etching a semiconductor substrate 3 as shown in FIG. 2A will be explained by way of example. In the semiconductor substrate 3 shown in FIG. 2A, an n-type epitaxial layer 3b is formed on a p-type substrate 3a; a p-type diffusion layer 3c is formed in this n-type epitaxial layer 3b; and two opposite silicon oxide films 3d and 3e are patterned on the n-type epitaxial layer 3b and the p-type substrate 3a, respectively. Further, an aluminium electrode 3f is formed on the n-type epitaxial layer 3b and the silicon oxide film 3d.

The p-type substrate 3a of the semiconductor substrate 3 as shown 2A can be electrolytically etched with the electrolytic etching apparatus as shown in FIG. 1 in accordance with etching characteristics as shown in FIG. 3A.

FIG. 3A shows the relationship between the electrode potential V2 (V) of the substrate 3 relative to the reference electrode 6 (Ag/AgCl) and the current density (mA/cm$^2$) flowing through the substrate 3, the etching rate ($\mu$m/min), in which a solid line N1 denotes the current density of n-type silicon substrate; a solid line P1 denotes that of p-type silicon substrate; a dashed line N2 denotes the etching rate of n-type silicon substrate; and P2 denotes that of p-type silicon substrate.

FIG. 3A indicates that the current density increases with increasing substrate potential relative to the reference electrode (Ag/AgCl) 6 but drops sharply at a substrate potential of about $-0.95$ V or higher in the case of n-type silicon substrate and of about $-0.75$ V or higher in the case of p-type silicon substrate. This is because as the substrate potential relative to the reference electrode 6 increases, oxide current is generated so that an anodic oxidation film is inevitably formed on the surface of the substrate 3. Here, the potential at which the current density starts to drop sharply is referred to as passivation potential. As shown in FIG. 3A, the passivation potential of n-type silicon layer ($-0.95$ V) is lower by about 0.2 V than that ($-0.75$ V) of p-type silicon layer. Therefore, when the potential of the semiconductor substrate 3 relative to the reference electrode 6 is kept at Vb=$-0.8$ V, for instance, it is possible to obtain such a potential condition that n-type silicon will not be etched but p-type silicon can be etched, as shown by the dashed lines N2 and P2 in FIG. 3A.

Accordingly, when the semiconductor substrate 3 is electrolytically etched by maintaining the substrate potential V2 relative to the reference electrode 6 under these condition by controlling the variable voltage power supply 5 while monitoring the current density flowing through the substrate 3, it is possible to selectively etch the p-type substrate 3a and the p-type diffusion layer 3c of the semiconductor substrate, without etching the n-type layer 3b, with the patterned silicon oxide film 3e as mask, until the p-type diffusion layer 3c is etched to the silicon oxide film 3d, as depicted in FIG. 2B.

In this connection, when a voltage is being applied, since the pn junction is formed between the p-type silicon substrate 3a and the n-type silicon layer 3b under backward reversed bias condition (since a position voltage is applied to the n-type layer 3b), no voltage is applied to the p-type silicon layer 3c at the start of etching. However, when the p-type silicon substrate 3a is etched in such a degree that the n-type silicon layer 3b is exposed, since a voltage is applied to an interface between the n-type silicon layer 3b and the etching liquid, the p-type layer 3c can be etched. However, when the voltage applied to the interface rises up to 3.6 V or higher, since an anodic oxidation film is formed on the surface of the n-type silicon layer 3b, no current flows, as is well known. In other words, the n-type silicon layer 3b will not be etched, because the formed anodic oxidation film serves as a mask. Therefore, it is possible to selectively etch only the p-type silicon substrate 3a by keeping the applied voltage at 3.6 V or higher.

However, when a high voltage of 3.6 V or higher is kept applied from the initial etching stage, there exists such a problem as described below.

For instance, in the case where the etching liquid is 100% hydrazine hydrate heated at 95° C. and the masking material is 1 $\mu$m-thick PSG (phospho-silicate Glass) film or 1 $\mu$m-thick silicon nitride film formed by plasma CVD (Chemical Vapor Deposition), if the semiconductor substrate 3 is etched by keeping the potential of the substrate 3 relative to the reference electrode 6 at $-0.8$ V, there exists a problem, as shown in FIG. 3B, in that the mask material is locally damaged and therefore the surface of the silicon substrate 3 is partially exposed under the mask at time t1 (e.g. after 2 hours), so that the p-type silicon substrate 3a under the mask is inevitably etched. Accordingly, current increases sharply after t1, and further continues to increase after etching has reached the interface between the p-type substrate 3a and the n-type layer 3b. In summary, when a relatively high voltage is applied from the start of etching, there exists a problem in that the mask material is also etched, so that the production yield of the semiconductor substrate is markedly reduced.

SUMMARY OF THE INVENTION

With these problems in mind, therefore, it is the primary object of the present invention to provide a stable method of etching a semiconductor substrate without applying a relatively high voltage to the semiconductor substrate from the start of etching and without being subjected to the influence of fluctuations in etching liquid conditions.

To achieve the above-mentioned object, the present invention provides a method of etching a semiconductor substrate having a first conductivity type layer (3b) and a second conductivity type layer (3a) opposite to the first conductivity type layer and immersed in an electrolytic solution, comprising the steps of: (a) applying an etching voltage to the first conductivity type layer (3b); (b) integrating etching current flowing through the semiconductor substrate; and (c) controlling the etching voltage on the basis of the integrated etching current to selectively etch the second conductivity type layer (3a).

The step of controlling the etching voltage comprises the steps of: (a) comparing the integrated etching current value with a predetermined reference value R; (b) if the integrated etching current value is equal to or higher than the reference value, increasing the etching voltage; (c) detecting the etching current; (d) checking whether etching potential of the semiconductor substrate relative to a reference electrode reaches a predetermined value Vb; (e) if the checked etching potential is less than the predetermined value, further increasing the etching voltage; (f) if the checked etching potential reaches the predetermined value, keeping the increased etching voltage to continuously etch the substrate; (g) checking whether the etching current drops sharply; (h) if the etching current does not drop sharply, continuing to etch the substrate; and (i) if the checked etching current drops sharply, stopping etching the semiconductor substrate.

The etching voltage initially applied to the first conductivity type layer in step (a) is a voltage which is a little higher than an open voltage corresponding to a battery voltage generated between the semiconductor substrate and a reference electrode in the electrolytic solution. The reference value R of the integrated etching current value is a value required to etch the second conductivity type layer (3b) to a predetermined depth under previously determined etching conditions. The reference value of the etching potential Vb of the semiconductor substrate is a value at which the first conductivity type layer (3b) is not etched but only the second conductivity type layer (3a) is etched. The etching current drops sharply in step (g) of claim 1 due to formation of an anodic oxidation film on the first semiconductor layer.

Further, it is preferable to calculate a voltage increase rate G before increasing the etching voltage. This voltage increase rate calculating step comprises: (a) previously determining a total integrated etching current value Qt required to etch the semiconductor substrate; (b) calculating an integrated current value Q2 required after the etching voltage has been increased, by subtracting Q1 from Qt, where Q1 denotes an integrated etching current value before the etching voltage is increased; (c) calculating an etching voltage increase end time point tb on the basis of the calculated integrated current value Q2, an etching voltage increase start time point, ta, an etching current, ia, at etching voltage increase start, and an etching current, ib, at etching voltage increase end; and (d) calculating an etching voltage increase rate G on the basis of the etching voltage increase start and end time points ta and tb and the etching currents ia and ib at ta and tb.

In the method according to the present invention, since the etching rate is interrelated to the integrated etching current value, the second conductivity (p) type layer is etched to a predetermined depth until the integrated current value reaches a predetermined value. Thereafter, the etching voltage is increased gradually so that the potential of the substrate potential relative to the reference electrode reaches a predetermined potential at which only the second conductivity (p) type layer can be etched and the first conductivity (n) type layer cannot be etched, to selectively etch only the second conductivity (p) type layer. Further, when an anodic oxidation film is formed on the first conductivity (n) type layer, since the etching current drops sharply, the etching is stopped.

Therefore, it is possible to improve the etching reproducibility and therefore reliability for each batch of semiconductor substrates, without being subjected to the influence of fluctuations in etching liquid conditions such as sorts, composition, density, degradation, temperature, agitation, etc.

DETAILED DESCRIPTION OF THE PREFERRED EMBODIMENTS

Prior to the description of the embodiments of the present invention, another method of etching a semiconductor substrate proposed by the same inventor will be published on Mar. 13, 1990 in Japan but not filed to U.S. PTO.

Figure 1:
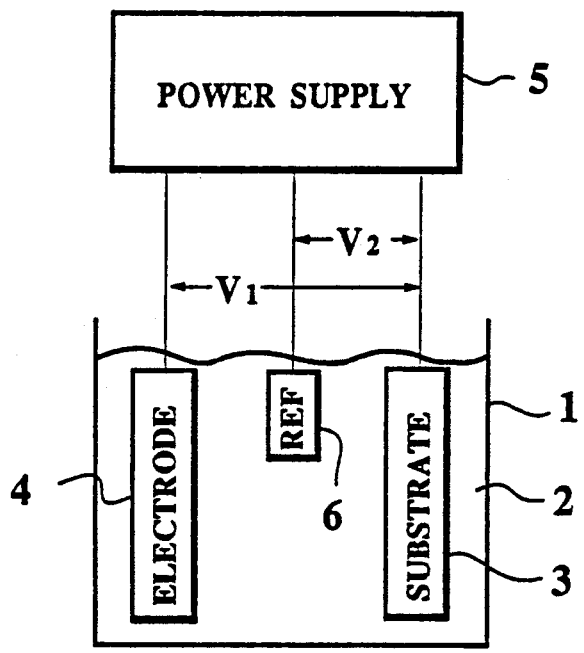
FIG. 1 is a diagrammatical illustration showing a prior-art electrolytic etching apparatus.
Figure 2A:
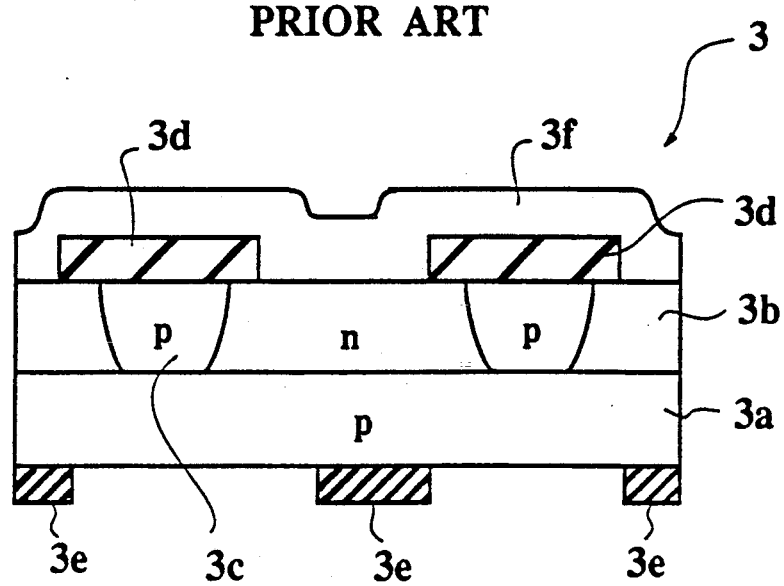
FIG. 2A is a cross-sectional view showing an example of a semiconductor substrate before etched.
Figure 2B:
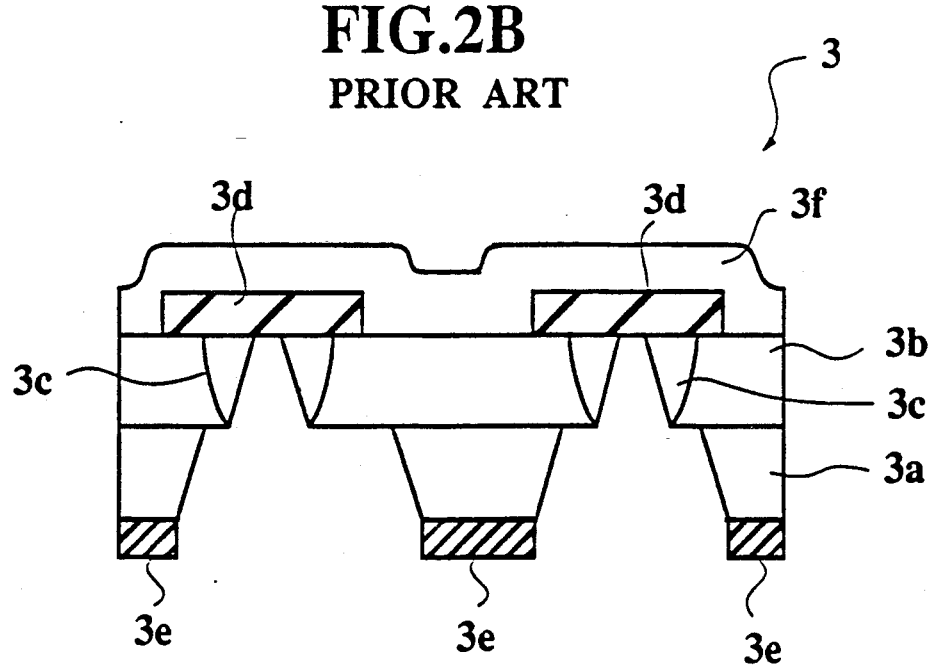
FIG. 2B is a cross-sectional view showing an example of the same semiconductor substrate after etched.
Figure 4A:
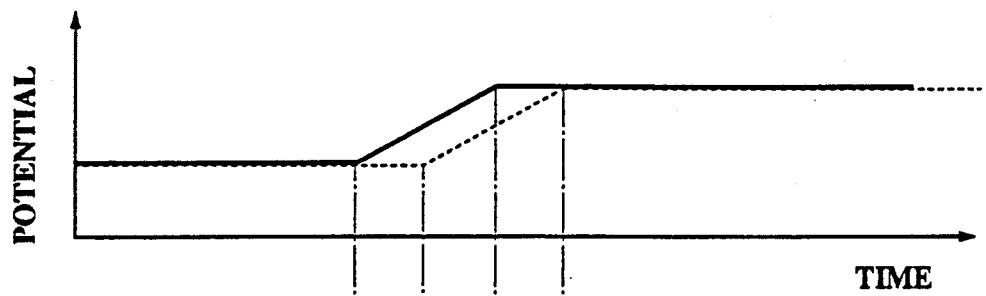
FIG. 4A is a graphical representation showing an example of etching potential variation with the lapse of time.
Figure 4B:
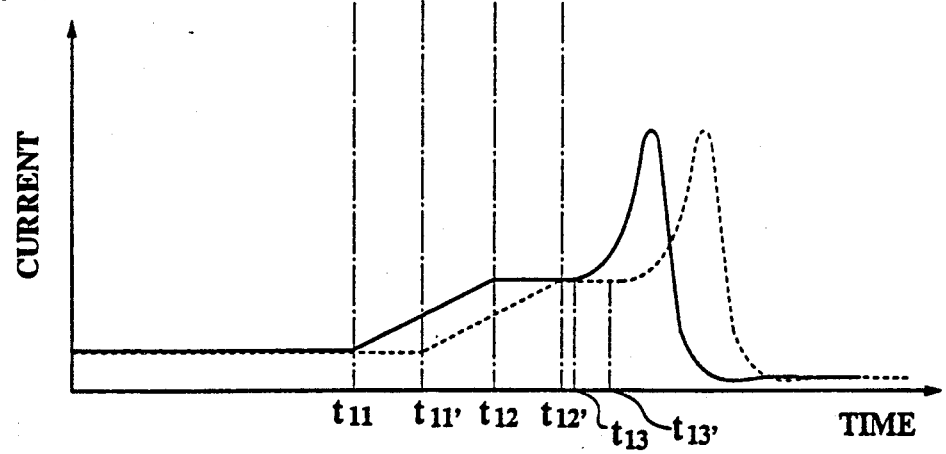
FIG. 4B is a graphical representation showing an example of etching current variation with the lapse of time.

In the above-mentioned patent document, the etching potential is first kept at a relatively low voltage and then increased at a predetermined timing, in order to prevent the masking material from being damaged. In more detail, FIGS. 4A and 4B show the potential relative to the reference electrode and the current density of a semiconductor substrate with the lapse of time, which are obtained when two different etching liquids 1 and 2 are used. With reference to these drawings, the potential of the substrate 3 (as shown in FIG. 2A, for instance) relative to the reference electrode 6 is increased by scanning (increasing) voltage at time t11 or t11', and kept at a constant value at time t12 or t12', as shown in FIG. 4A. Under these conditions, the current is also increased in proportion to the increased potential from time t11 or t11' and then kept at a constant level at time t12 or t12'. Thereafter, when the n-type epitaxial layer 3b (as shown in FIG. 2B, for instance) is exposed at time t13 or t13', since the surface of the exposed n-type epitaxial layer 3b is anodic-oxidized, oxidation current is generated, so that current increases sharply as shown in FIG. 4B. However, when the surface of the n-type epitaxial layer 3b has been covered with an anodic oxidation film, the current between the substrate 3 and the opposing electrode 4 (as shown in FIG. 1) drops sharply, so that the etching of the p-type silicon substrate 3 is completed.

In summary, the potential of the substrate 3 relative to the reference electrode 6 is increased; an abrupt change in current flowing between the substrate 3 and the opposing electrode 4 is detected (at anodic oxidation start); the potential of the substrate 3 relative to the reference electrode 6 is detected at this time; and the potential is so controlled that the etching current is kept lower than the value obtained at anodic oxidation start but higher than the value obtained after the n-type substrate has been covered by an anodic oxidation film.

In the above-mentioned already proposed method, however, there exists a problem in that the potential and the current characteristics are subject to the influence of etching conditions such as the sort, composition, density, degradation, temperature, agitation, etc. of the etching liquid, as shown by the solid and dashed lines in FIGS. 4A and 4B, so that it has been difficult to obtain reliability or reproducibility for each batch of semiconductor substrates. For instance, when 100% hydrazine hydrate of a relatively low ionization rate is used as the etching liquid, since the concentration of silicon ions increases as the etching process advances, the conductivity varies markedly and therefore the etching rate varies, so that it has been difficult to uniformly etch the semiconductor substrates by simply controlling the above-mentioned timing t11, t12, and t13 at which the etching voltage is increased, and therefore the production yield drops due to variation of the etching liquid with the lapse of time.

In view of the above description, the embodiments of the method of etching semiconductor substrates according to the present invention will be described hereinbelow.

Figure 5:
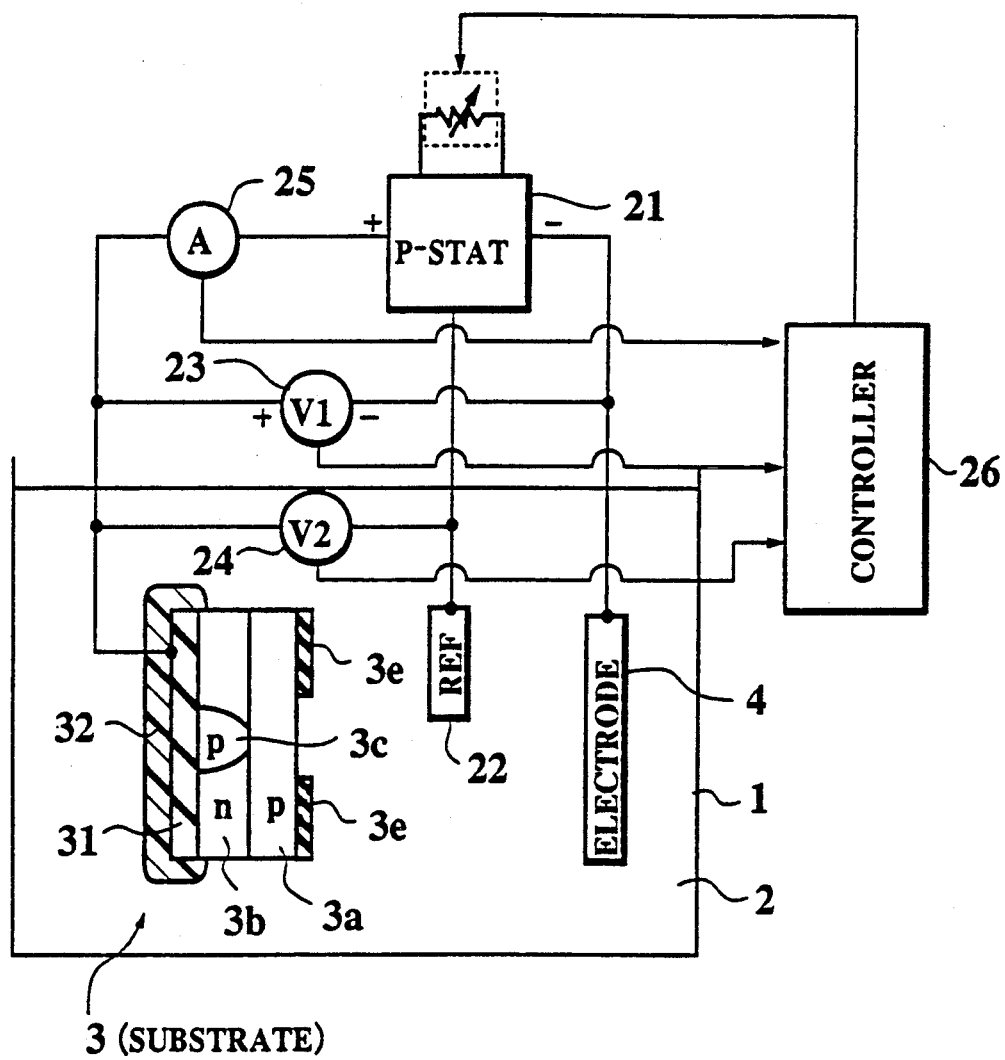
FIG. 5 is a diagrammatical illustration showing an electrolytic etching apparatus according to the present invention.
Figure 6:
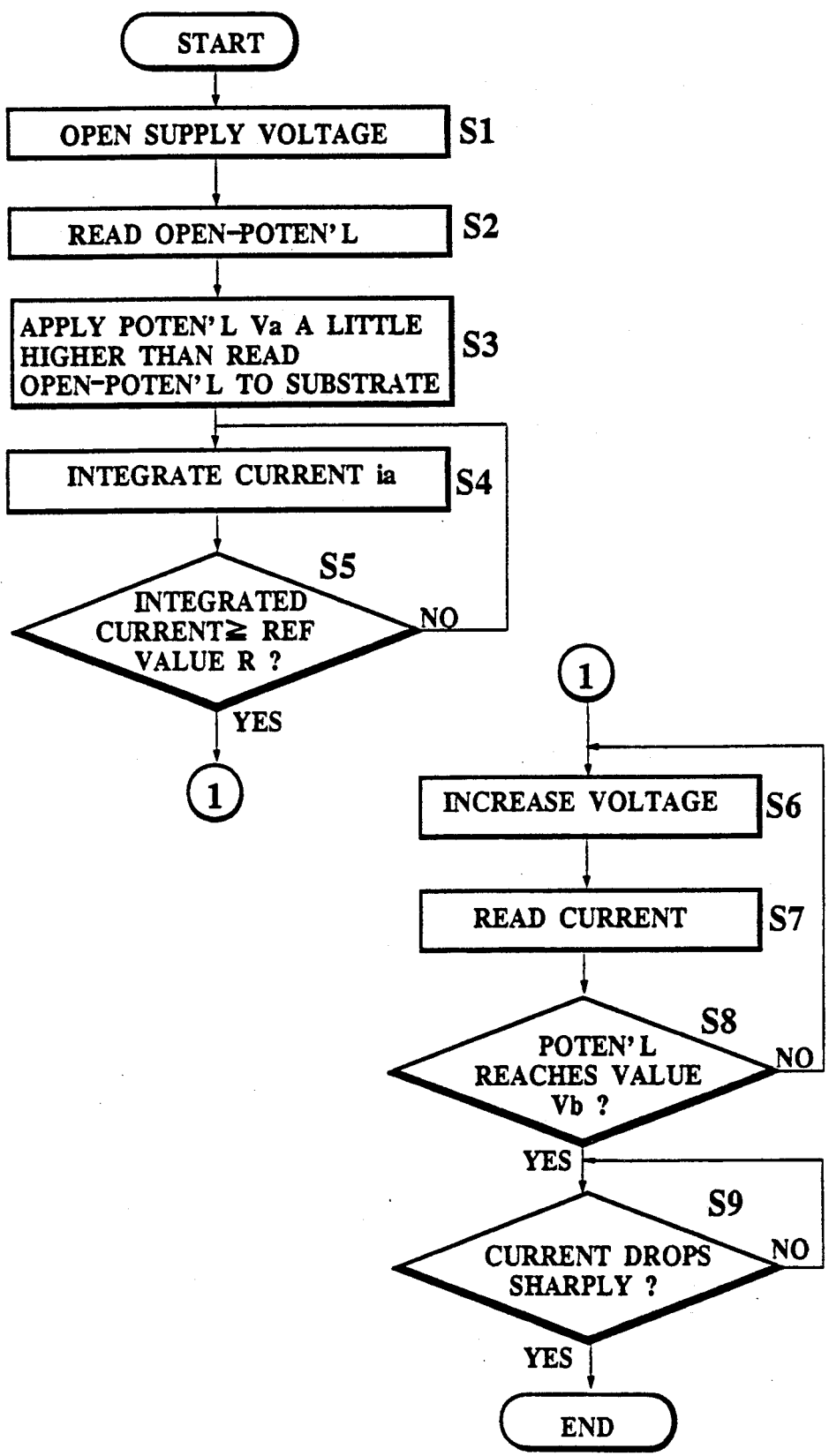
FIG. 6 is a flowchart for assistance in explaining a first embodiment of the etching procedure according to the present invention.

With reference to FIGS. 5, 6, and 7, a first embodiment thereof will be described. FIG. 5 shows an electrolytic etching apparatus. The etching apparatus comprises an electrolytic bath 1, an etching liquid (electrolytic solution) 2 in the electrolytic bath 1, a semiconductor substrate 3 to be etched, an opposing electrode 4, a reference electrode 22 (Ag/AgCl), a potentiostat (variable voltage supply) 21, a first voltmeter 23 a second voltmeter 24, an ammeter 25, and a controller 26.

The semiconductor substrate 3 is formed in such a structure, as shown in FIG. 5, that an n-type epitaxial layer 3b is formed on a p-type substrate 3a; a p-type diffusion layer 3c is formed in the n-type epitaxial layer 3b; a silicon oxide film 3e is patterned on the surface of the p-type substrate 3a; a metallic film 31 is formed on the n-type silicon layer 3b by vapor deposition; and a protective resin film 32 is formed on the metallic film 31.

The opposing electrode 4 is connected to a negative terminal of the potentiostat 21 and the metallic film 31 is connected to a positive terminal of the potentiostat 21. Further, the reference electrode 22 is immersed in the etching liquid 2 and connected to the potentiostat 21 and the second voltmeter 24 so that potential of the semiconductor substrate 3 relative to the reference electrode 22 can be detected by the second voltmeter 24. Further, voltage applied between the semiconductor substrate 3 and the opposing electrode 4 can be detected by the first voltmeter 23 and current flowing through the semiconductor substrate 3 can be detected by the ammeter 25. The detected output values of these voltmeters 23 and 24 and the ammeter 25 are given to the controller 26. The controller 26 integrates the etching current flowing through the semiconductor substrate 3 and controls the output voltage V1 of the potentiostat 21 or the potential V2 of the semiconductor substrate 3 on the basis of the integrated etching current value, as described in further detail below.

Figure 7A:
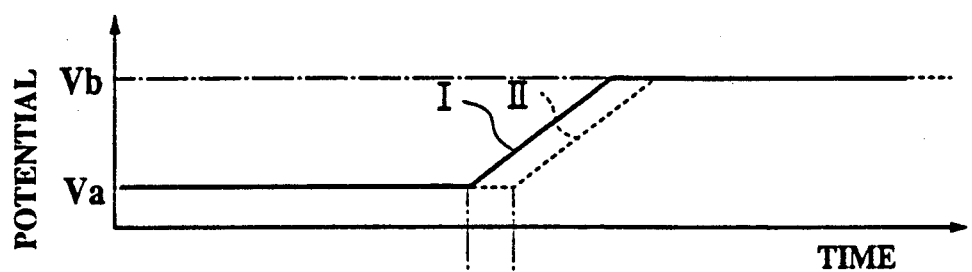
FIG. 7A is a graphical representation showing an example of etching potential variation with the lapse of time according to the first embodiment.
Figure 7B:
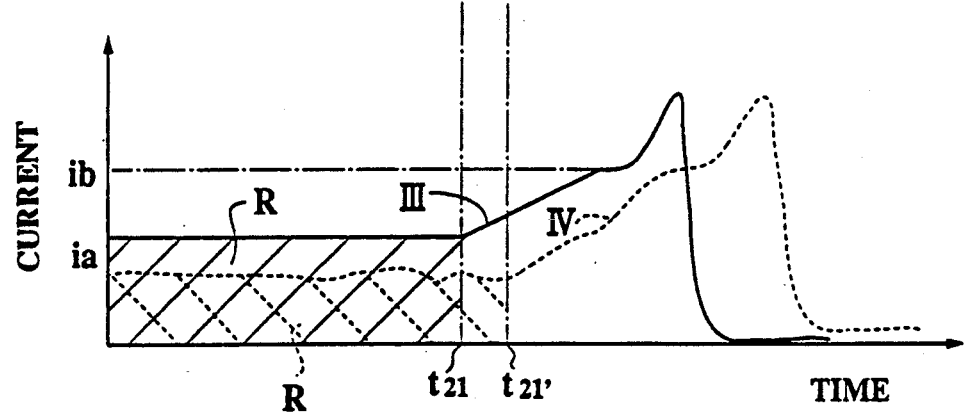
FIG. 7B is a graphical representation showing an example of etching current variation with the lapse of time according to the first embodiment.

With reference to FIGS. 6 and 7, the procedure of the controller 26 executed in accordance with a program stored therein will be described in further detail below. Further, in FIG. 7A, the solid line I and the dashed line II indicate the reference potential V2 of the semiconductor substrate 3 detected by the second voltmeter 24 under two different etching liquid conditions; and in FIG. 7B, the solid line III and the dashed line IV indicate the current flowing through the substrate 3 and detected by the ammeter 25 also under two different etching liquid conditions.

Upon start of etching, control the controller first opens tne output of the potentiostat 21 for initialization (in step S1). Where hydrazine hydrate is used as the etching liquid, the open (initial) potential is about $-1.45$ V relative to the reference (Ag/AgCl) electrode 22. This open voltage is a cell voltage generated between the semiconductor substrate 3 and the reference electrode 22. The controller reads the open potential (in step S2), controls the potentiostat 21 so that a potential Va (e.g. about −1.2 V) relative to the reference electrode 22 a little (e.g. 0.25 V) higher than the read open potential (e.g. −1.45 V) can be obtained, and applies the obtained potential to the substrate 3 for etching start (in step S3). Further, the controller detects the current, ia, flowing through the substrate 3 by the ammeter 25 and further integrates the detected current value (in step S4). The controller checks whether the integrated current value is equal to or higher than a predetermined reference value R (in step S5). If NO (in step S5), the substrate 3 is kept etched on the basis of the same voltage until the step S5 determines YES. If YES after thus etched; that is, if the integrated current value is higher than the predetermined value R (in step S5), the controller proceeds to the succeeding step at time point t21 shown in FIG. 7A.

Here, the reference integration value R can be determined as follows: the current flowing through the substrate 3 fluctuates as shown by the solid line III and dashed line IV in FIG. 7B, for instance, even if two semiconductor substrates of the same structure and with the same area are etched under the same etching conditions.

On the other hand, when the semiconductor substrate 3 is etched by applying a voltage, since the integrated current value ΣI flowing through the substrate 3 is an addition of a first integrated value Σi1 of current flowing due to dissolution of anode of the substrate 3 and a second integrated value Σi2 of current flowing due to minor electrochemical reaction such as dissolution of the etching liquid, the total integrated current value ΣI is mutually related to the etching rate of the substrate 3. Therefore, the reference integration value R is determined by initially obtaining an integrated current value ΣI required to etch the p-type silicon substrate 3a to a predetermined distance away from the interface between the p-type silicon substrate 3a and the n-type silicon layer 3b under predetermined etching conditions. Accordingly, when the reference value R is thus determined, it is possible to etch the p-type silicon substrate 3a to a predetermined depth till the time point t21 or t21' at which the integrated value ΣI reaches the reference value R, even if etching parameters such as etching liquid conditions fluctuate between batches of the semiconductor substrates.

Figure 3A:
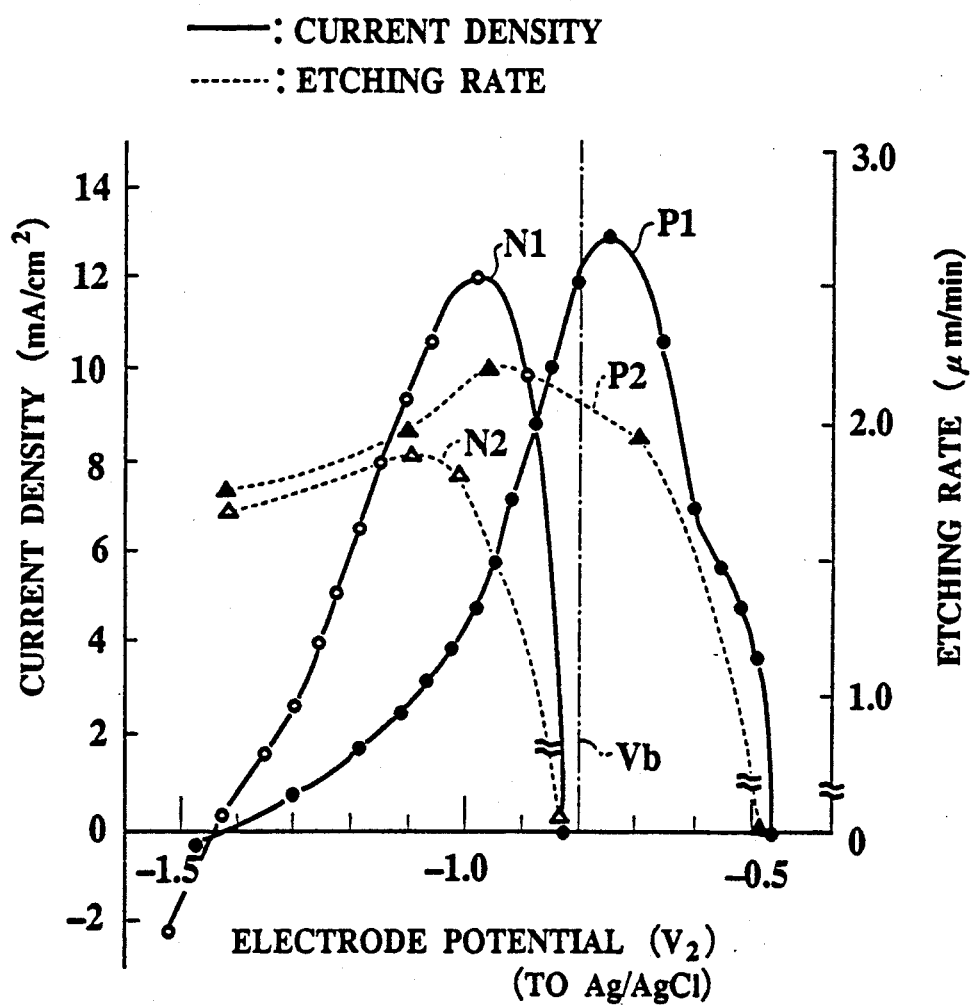
FIG. 3A is a graphical representation showing the characteristics between the electrode potential of the semiconductor substrate relative to the reference electrode (Ag/AgCl) and the current, density (solid lines), the etching rate (dashed lines) in both n- or p-type silicon substrate.

The controller increases the etching voltage V1 applied to the substrate 3 a little by scanning the potentiostat voltage (in step S6). In this step S6, since the reference potential V2 is also increased, the substrate 3a is further etched. At the same time, the etching current increases as the applied voltage V1 increases. The controller reads the etching current value detected by the ammeter 25 (in step S7) and checks whether the potential V2 reaches a predetermined potential value Vb (in step S8). Here, the above predetermined potential value is a potential Vb at which the p-type silicon continues to be etched but the n-type silicon stops being etched, for instance as about. −0.8 V relative to the reference electrode 22, as shown in FIG. 3A.

Figure 3B:
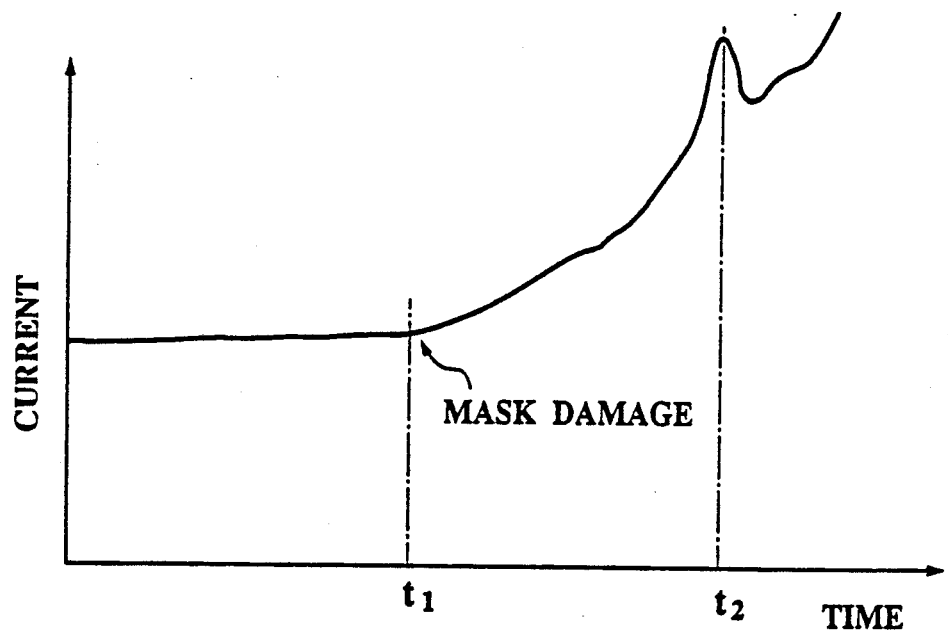
FIG. 3B is a graphical representation showing an example of etching current variation with the lapse of time in the prior-art etching method.

That is, when the voltage V1 applied to the substrate 3 increases and therefore the potential V2 relative to the reference electrode 22 reaches a predetermined value Vb, since YES (in step S8), the voltage V1 applied to the substrate is no longer increased. However, when the potential V2 is lower than the predetermined potential value Vb, since NO (in step S8), the etching voltage is kept increased (in step S6). The above steps from S6 to S8 are repeated until the potential V2 reaches the predetermined value Vb (in step S8). If YES (in step S8), the controller continues to etch the substrate 3 on the basis of the predetermined potential Vb (in step S9). However, when the p-type silicon substrate 3a is removed and therefore the n-type silicon substrate 3b is exposed, since the surface of the n-type layer 3b is anodic oxidized, so that an oxidation current is produced and therefore the etching current once rises sharply as shown in FIG. 3B. However, when the surface of the n-type substrate 3b is covered with an anodic oxidation film, the etching current flowing between the substrate 3 and the opposing electrode 4 drops then sharply. Therefore, if the controller determines that the etching current drops sharply; that is, YES (in step S9), the controller completes the etching of the n-type silicon substrate 3b. If NO (in step S9), the controller continues to etch the substrate 3.

As described above, in the first embodiment of the present invention, since the etching voltage is increased or scanned when the integrated etching current value reaches the reference value R and therefore the p-type silicon substrate 3a has been etched to a previously determined constant depth, it is possible to improve the reproducibility even when etching parameters such as etching liquid conditions fluctuate for each batch, thus enabling a more reliable etching and thereby improving the production yield.

Figure 8A:
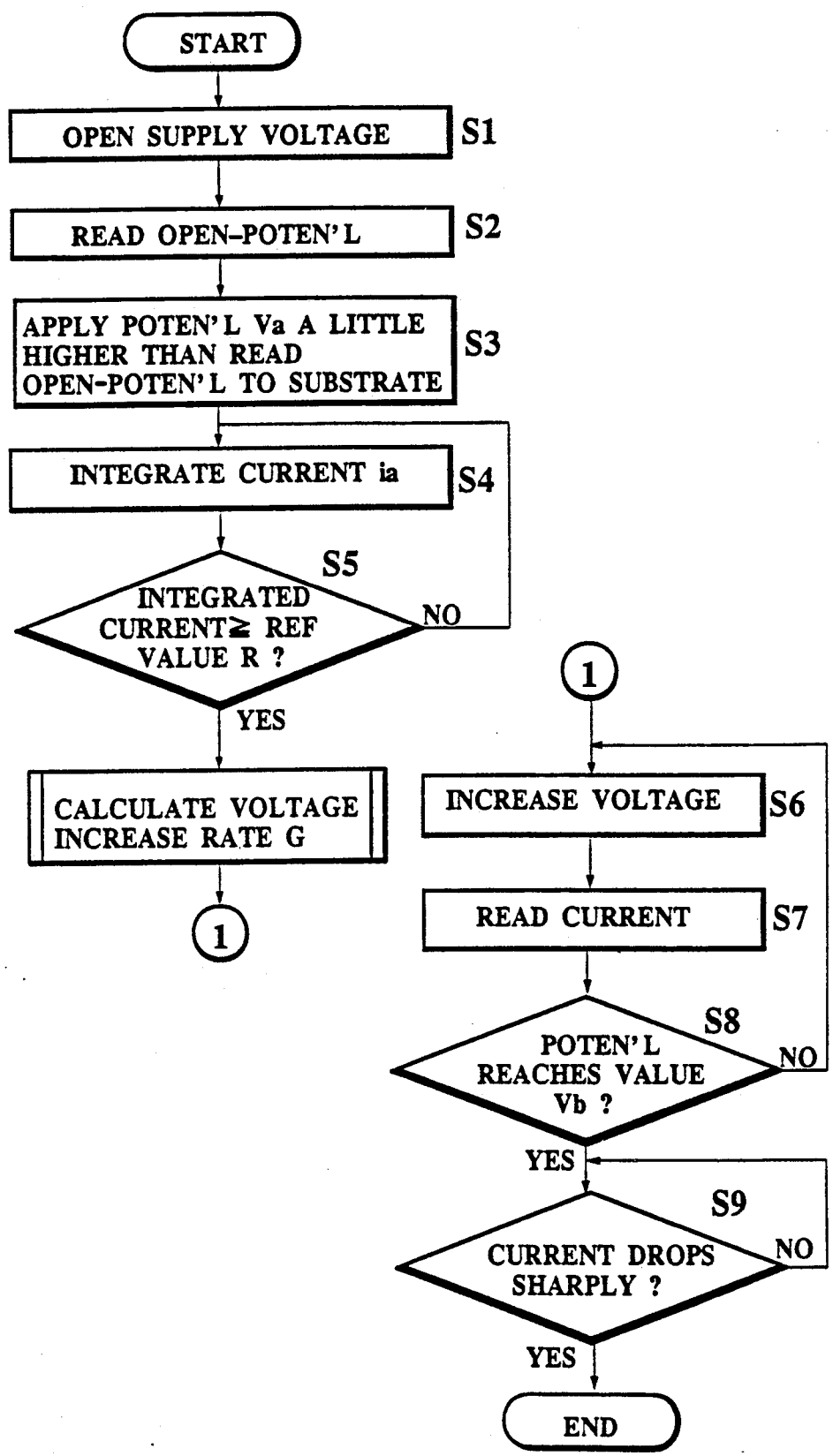
FIG. 8A is a flowchart for assistance in explaining a second embodiment of the etching procedure according to the present invention.

With reference to FIGS. 8 and 9, a second embodiment of the present invention will be described hereinbelow. The control procedure of the sedond embodiment is the same as the first embodiment, except the step of calculating a voltage increase rate, as shown by S10 in FIG. 8A. Therefore, the same references have been retained for similar steps which have the same function, without repeating any detailed description of them.

The feature of this second embodiment is to previously measure a total integrated current value Qt required to etch the substrate to a predetermined etching rate and further to determine a voltage increase rate on the basis of the measured total integrated current value Qt and an integrated current value Q1 (or R) from the etching start to the time point ta at which the etching voltage is increased.

Figure 9A:
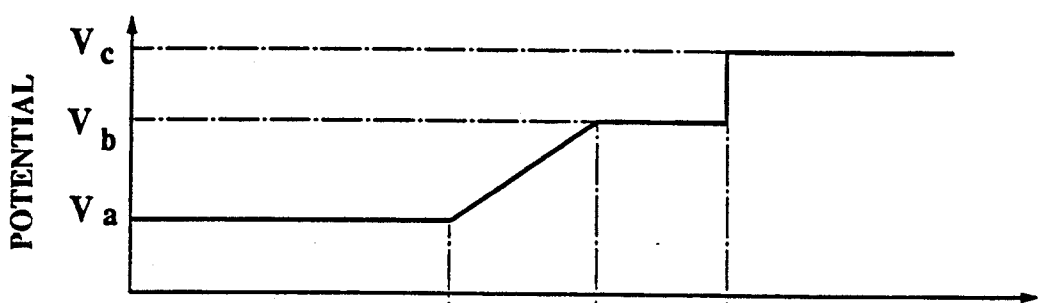
FIG. 9A is a graphical representation showing an example of etching potential variation with the lapse of time according to the second embodiment.
Figure 9B:
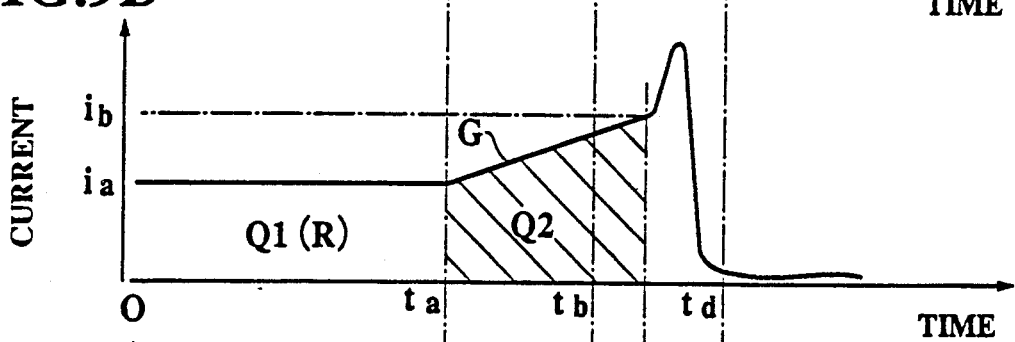
FIG. 9B is a graphical representation showing an example of etching current variation with the lapse of time according to the second embodiment.

With reference to FIGS. 9A and 9B, the method of calculating a voltage increase rate will be explained in further detail.

An integrated value Qx of the etching current flowing through the semiconductor substrate can be expressed as $$Qx = \int i\, dt \qquad (1)$$

The etching rate Rx determined by the integrated current value Qx can be expressed as $$Rx = k \cdot Qx \qquad (2)$$

where k denotes a constant.

Therefore, the total etching rate Rnt can be expressed as $$Rnt = Rn1 + Rn2 \qquad (3)$$

$$Rn1 = k \cdot Q1 \qquad (4)$$

$$Rn2 = k \cdot Q2 \qquad (5)$$

where Rn1 denotes an etching rate calculated from the etching start time point O to the time point ta at which the integrated current value reaches Q1 (or R); Rn2 denotes an etching rate calculated after the time point ta at which the voltage has been increased; and Q1 and Q2 can be expressed as follows:

$$Q1 = \int_0^{ta} i \cdot dt \tag{6}$$

$$Q2 = \int_{ta}^{tb} i \cdot dt = \frac{1}{2}(ia + ib)(ta - tb) \tag{7}$$

Therefore, the remaining etching rate Rn2 can be calculated in accordance with a above formulae (5) and (7).

Here, the time point tb can be obtained as follows: the etching start current ia and the etching end current ib are both previously known on the basis of the initial potential Va applied to the substrate at the etching start and the final potential Vb applied to the substrate at the etching end. Further, the time point ta at which the etching voltage is increased is also previously known before the step S10 in FIG. 8A. Since Q2 can be obtained by (Qt−Q1) at the time point ta, it is possible to determine the time point tb at which the area of the trapezoid as shown by the hatch in FIG. 9B becomes equal to Q2.

Since the voltage increase start current ia, the voltage increase end current ib, the voltage increase start time point ta, and the voltage increase end time point tb are all now known or calculated, a voltage increase rate G can be obtained as $$G = \frac{ia - ib}{tb - ta} \tag{8}$$

Once th voltage increase rate G is obtained, since the total etching rate Rnt required till the voltage increase end time point tb can be obtained, the n-type silicon layer 3b is exposed and therefore an anodic oxidation current begins to flow, so that the etching current rises and drops sharply as shown in FIG. 9B.

Figure 9C:
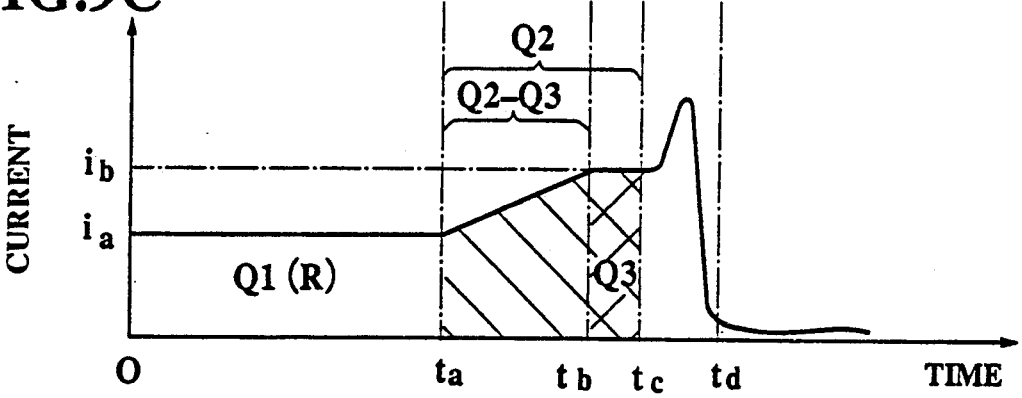
FIG. 9C is a graphical representation showing another example of etching current variation with the lapse of time according to a modification of the second embodiment.

FIG. 9C is a current graph with the lapse of time for assistance in explaining a first modification of the second embodiment.

In the case where a large-diameter semiconductor substrate is etched, there exists a tendency that the etching rate is not uniform and therefore differs on the surface of the semiconductor substrate; that is, areas where the etching rate is not sufficient partially exist. To overcome this problem, it is preferable that a constant voltage Vb is kept applied after the time point tb for a predetermined time duration according to the necessity, so that a more sufficient total etching rate Rnt can be obtained at the time point tc all over the surface of the semiconductor substrate.

In FIG. 9C, the duration (tc−tb) is determined to be from 5 minutes to several tens minutes. In this modification, the voltage increase end time point tb can be calculated as follows:

$$Q2 - Q3 = \frac{1}{2}(ia + ib)(ta - tb) \tag{9}$$

where Q3 denotes the integrated current value from tb to tc.

Further, the etching rate ER1 to the time point ta can be estimated as $$ER1 = \frac{Rn1}{A \cdot ta} = \frac{k}{A \cdot ta} \int_0^{ta} i \cdot dt \tag{10}$$

FIG. 8A shows the procedure of the second embodiment. That is, when the controller determines that the integrated current value reaches Q1 (or R) or YES (in step S5), the controller proceeds to the succeeding step to calculate the voltage increase rate (in step S10), before increasing (scanning) the voltage applied to the substrate (in step S6).

Figure 8B:
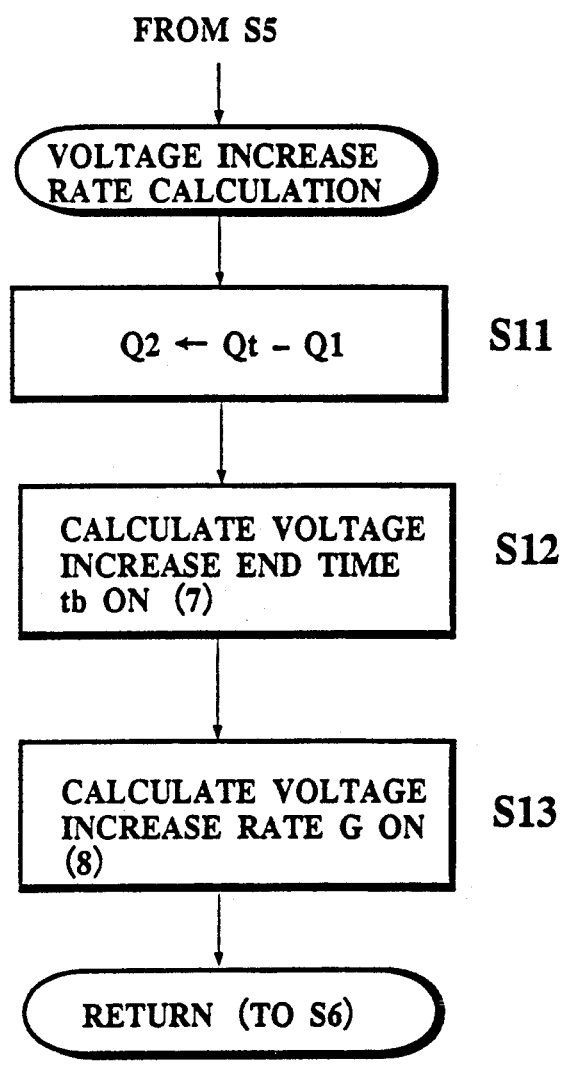
FIG. 8B is a flowchart for assistance in explaining the voltage increase rate calculation step of the second embodiment of the etching procedure according to the present invention.

FIG. 8B shows the procedure of method of calculating the voltage increase rate executed in step S10 in further detail. That is, controller calculates an integrated current value Q2 required for the remaining etching by subtracting the already integrated current value Q1 from the total integrated current value Qt (in step S11), and further calculating the scanning end time point tb in accordance with the formula (7) (in step S12). Finally, the controller calculates the voltage increase rate G in accordance with the formula (8) (in step S113), returning to the step S6 shown in FIG. 8A.

With reference in FIGS. 10 and 11, a third embodiment of the present invention will be described hereinbelow. The control procedure of this third embodiment is the same as the second embodiment, except the steps of sequentially varying the voltage increase rate according to the etching conditions after the etching voltage has been increased, as shown by steps 23 to 25 in FIGS. 10A and 10B. Therefore, the same references have been retained for similar steps which have the same function, without repeating any detailed description thereof.

In the second embodiment, once the voltage increase rate G has been calculated at the voltage increase start time point ta, the voltage is increased or scanned at the constant increase rate G till the etching end. In contrast with this, the feature of this third embodiment is to sequentially calculate the integrated current value Qn from the time point ta to the time point tb.

Figure 11A:
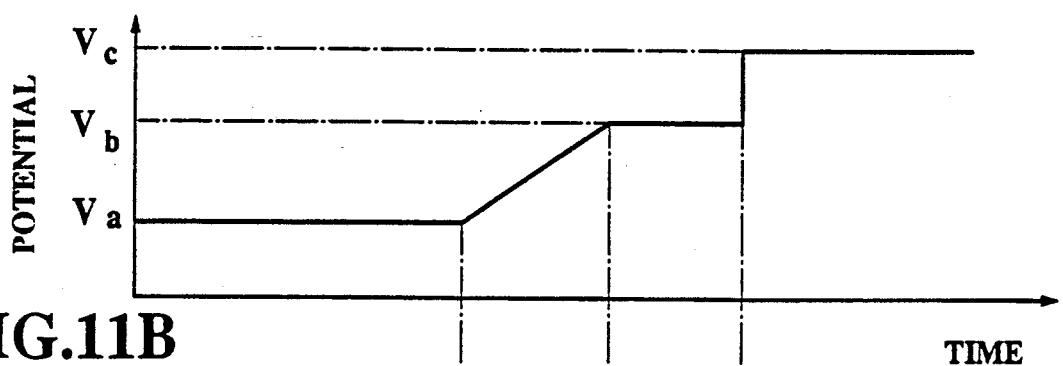
FIG. 11A is a graphical representation showing an example of etching potential variation with the lapse of time according to the third embodiment.
Figure 11B:
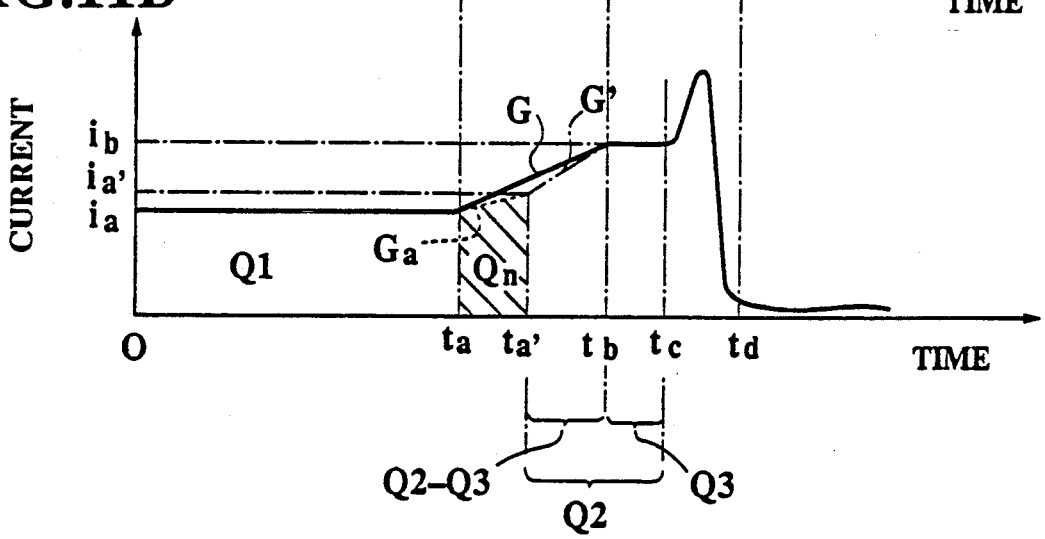
FIG. 11B is a graphical representation showing an example of etching current variation with the lapse of time according to the third embodiment.

With reference to FIGS. 11A and 11B, the method of sequentially calculating voltage increase rates will be explained in further detail.

At time point ta', for instance, an integrated current value (Q2−Q3) required for the remaining etching rate is calculated, and a voltage increase rate Ga' after the time point ta' is calculated on the basis of the time point ta', the current value ia' at the time point ta', the etching end time point tb, and the current value ib at the time point tb and in accordance with the formula (8). In FIG. 11B, G denotes a voltage increase rate calculated at the time point ta and Ga denotes a voltage increase rate estimated from the integrated current value Qn between the time points ta and ta'. As described above, the voltage increase rate Ga is sequentially calculated on the basis of the integrated current value Qn obtained during further shorter time duration.

Figure 10A:
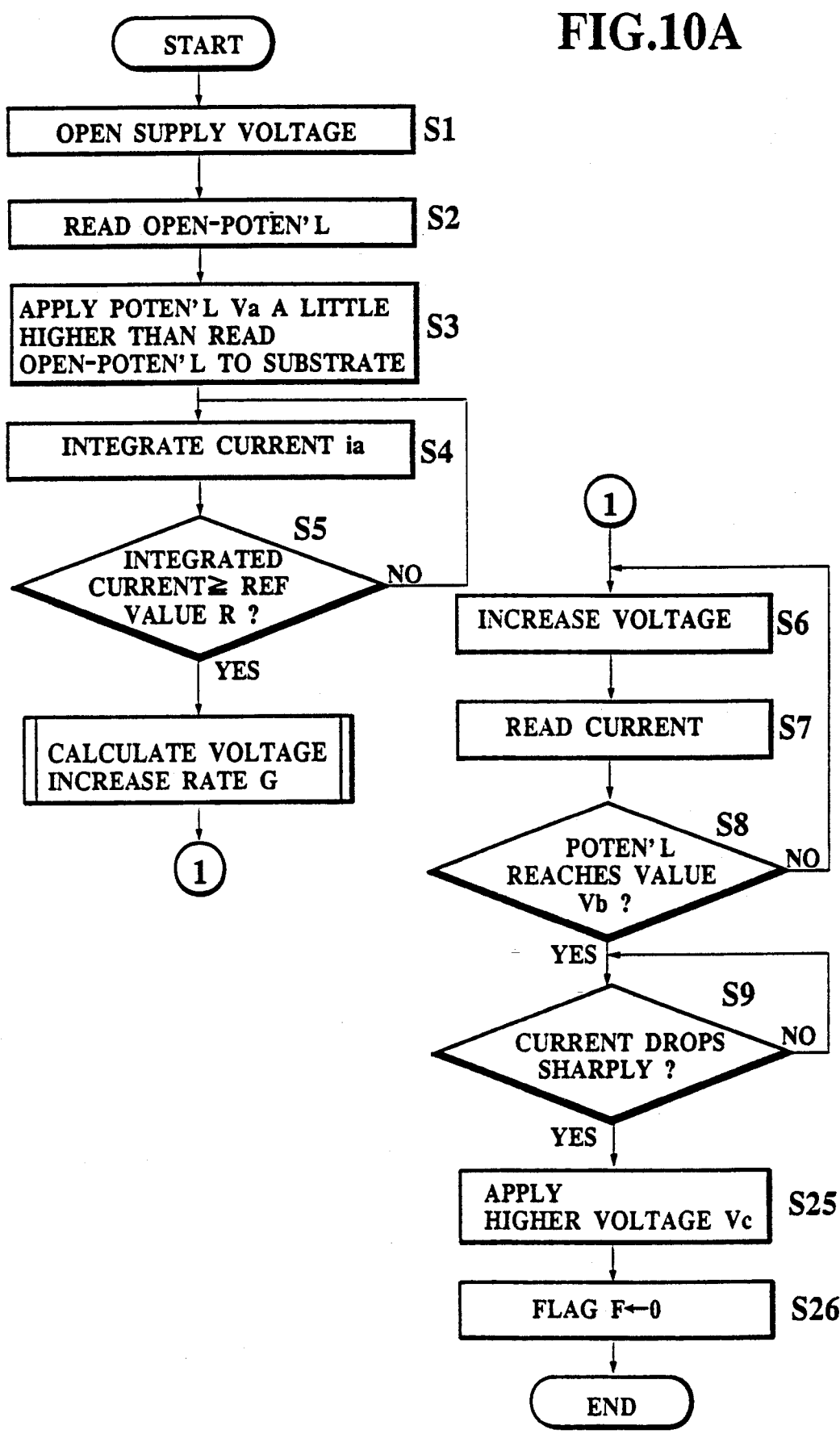
FIG. 10A is a flowchart for assistance in explaining a third embodiment of the etching procedure according to the present invention.

FIG. 10A shows the procedure of the third embodiment. That is, when the controller determines that the integrated current value reaches Q1 (or R) or YES (in step S5), it proceeds to the succeeding step to sequentially calculate the voltage increase rates (in step S10A), before increasing (scanning) the voltage applied to the substrate (in step S6).

Figure 10B:
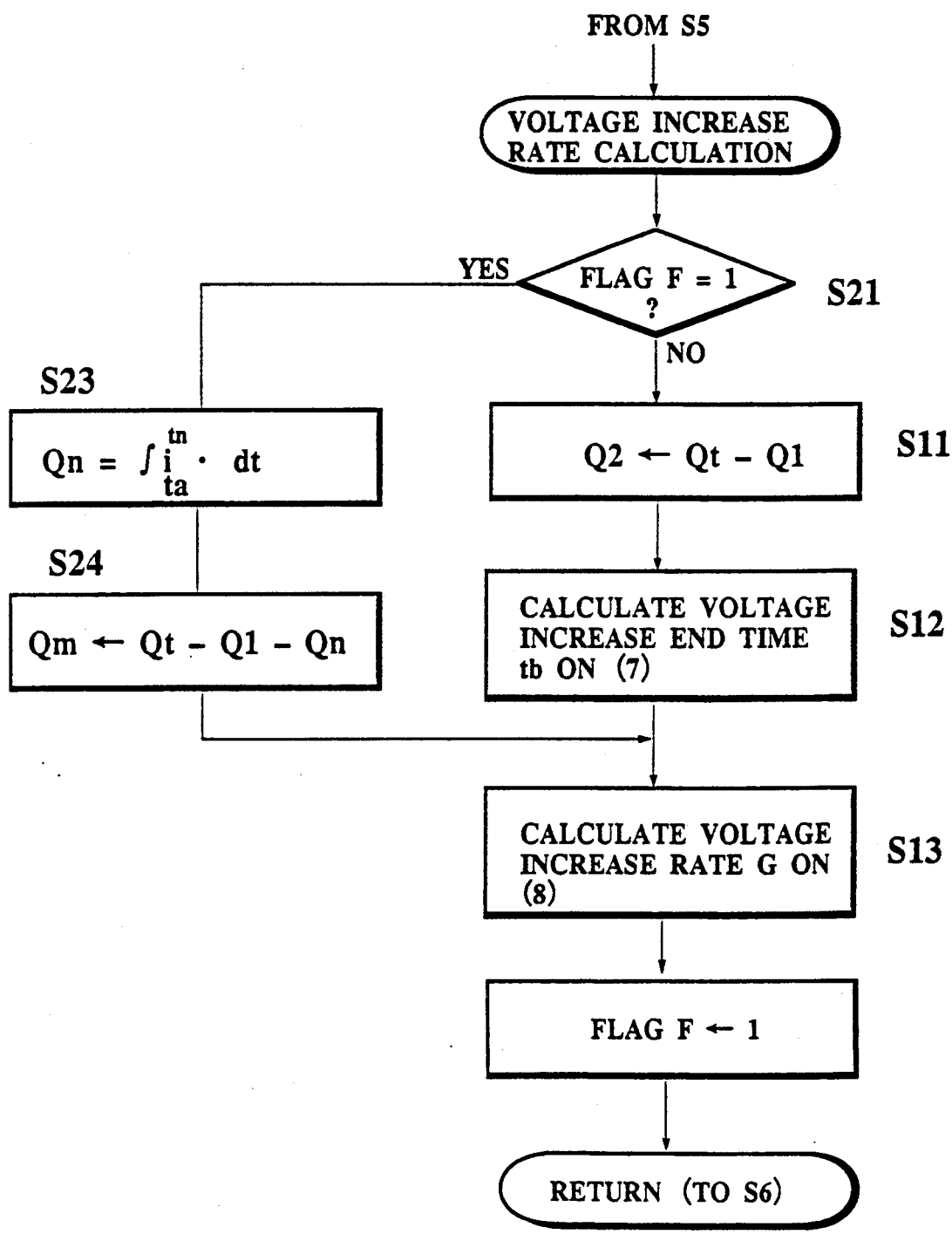
FIG. 10B is a flowchart representation for assistance in explaining the voltage increase rate calculating step of the third embodiment of the etching procedure according to the present invention.

FIG. 10B shows the procedure of the method of sequentially calculating the voltage increase rates executed in step S10A in further detail. That is, the controller checks whether a flag is set to 1 (in step S21). If NO, the controller executes the steps from S11 to S13 in the same way as in the second embodiment, and sets the flag to 1 (in step S22), returning to step S6 shown in FIG. 10A. However, if YES after a time ta has elapsed (in step S21), the controller proceeds to the succeeding steps to calculate an integrated current value Qn from ta to any given time point tn (in step S23) and further an integrated current rate Qm required for the remaining etching after tn (in step S24). Finally, the controller calculates a new voltage increase rate Ga' (in step S13).

Further, in FIG. 10A, if YES (in step S8), the controller stops to increase the etching voltage (in step S6), and executes the step S9 while keeping the potential at the constant value, so that etching is kept maintained until the current drops sharply. If YES (in step S9), the controller control proceeds to the succeeding step to set the voltage applied to the substrate to a higher voltage Vc at which the p- and n-type semiconductor substrates are both not etched as shown in FIG. 3A and FIGS. 9A and 11A (in step S25), and resets the flag to 0 (in step 26), before ending the procedure.

In this third embodiment, even if various etching conditions fluctuate according to the sorts, composition, density, degradation, temperature, agitation of the etching liquid, since the etching conditions can be momentarily adjusted by varying the voltage increase rate, it is possible to more reliably improve the reproducibility and the uniformity of semiconductor substrate etching. Therefore, it is possible to apply the method according to the present invention to a full automatic etching system.

As described above, in the method of etching semiconductor substrates according to the present invention, since the voltage applied to the substrate is controlled on the basis of integrated values of etching current flowing through the semiconductor substrate with respect to the lapse of time, it is possible to etch semiconductor substrates, without being subjected to the influence of fluctuations in various etching conditions, thereby improving the production yield in etching process of semiconductor substrates.

What is claimed is:

1. A method of etching a semiconductor substrate having a first conductivity type layer and a second conductivity type layer opposite to the first conductivity type layer and immersed in an electrolytic solution, comprising the steps of:
   (1) applying an etching voltage to the first conductivity type layer;
   (2) integrating etching current flowing through the semiconductor substrate; and
   (3) controlling the etching voltage on the basis of the integrated etching current to selectively etch the second conductivity type layer wherein the step of controlling the etching voltage comprises the steps of:
      (a) comparing the integrated etching current value with a predetermined reference value;
      (b) if the integrated etching current value is equal to or higher than the reference value, increasing the etching voltage;
      (c) detecting the etching current;
      (d) checking whether etching potential of the semiconductor substrate relative to a reference electrode reaches a predetermined value;
      (e) if the checked etching potential is less than the predetermined value, further increasing the etching voltage;
      (f) if the checked etching potential reaches the predetermined value, keeping the increased etching voltage to continuously etch the substrate;
      (g) checking whether the etching current drops sharply;
      (h) if the etching current does not drop sharply continuing to etch the substrate; and
      (i) if the checked etching current drops sharply, stopping etching the semiconductor substrate.

2. The method of etching a semiconductor substrate of claim 1, wherein the reference value of the integrated etching current value is a value required to etch the second conductivity type layer to a predetermined depth under previously determined etching conditions.

3. The method of etching a semiconductor substrate of claim 2, wherein the reference value of the etching potential of the semiconductor substrate is a value at which the first conductivity type layer is not etched but only the second conductivity type layer is etched.

4. The method of etching a semiconductor substrate of claim 1, wherein the etching current drops sharply in step (g) due to formation of an anodic oxidation film on the first semiconductor layer.

5. The method of etching a semiconductor substrate of claim 1, which further comprises the step of calculating a voltage increase rate before increasing the etching voltage in step (e).

6. The method of etching a semiconductor substrate of claim 5, wherein the step of calculating the voltage increase rate comprises the steps of:
   (a) previously determining a total integrated etching current value Qt required to etch the semiconductor substrate;
   (b) calculating an integrated current value Q2 required after the etching voltage has been increased, by substracting Q1 from Qt, where Q1 denotes an integrated etching current value before the etching voltage is increased:
   (c) calculating an etching voltage increase end time point tb on the basis of the calculated integrated current value Q2, an etching voltage increase start time point ta, an etching current ia at etching voltage increase start, and an etching currrent ib at etching voltage increase end; and
   (d) calculating an etching voltage increase rate G on the basis of the etching voltage increase start and end time points ta and tb and the etching currents ia and ib at ta and tb.

7. The method of etching a semiconductor substrate of claim 6, wherein the etching voltage increase end time point tb is calculated in accordance with the following formula $$Q2 = \frac{1}{2} (ia + ib)(ta - tb)$$

and the etching voltage increase rate G is calculated in accordance with the following formula $$G = \frac{(ia - ib)}{(tb - ta)}$$

8. The method of etching a semiconductor substrate of claim 6, which further comprises the step of calculating the voltage increase rate in such a way that the constant etching current ib at etching voltage increase end time point tb is kept applied to the semiconductor substrate for a predetermined time period (tc−tb) to obtain an excessive integrated current value Q2 after the etching voltage has been increased.

9. The method of etching a semiconductor substrate of claim 6, wherein the etching voltage increase rates G are sequentially calculated according to etching conditions between the etching voltage increase start time point ta and the etching voltage increase end time point tb.

10. A method of etching a semiconductor substrate having a first conductivity type layer and a second conductivity type layer opposite to the first conductivity type layer and immersed in an electrolytic solution, comprising the steps of:
  (a) applying an etching voltage to the first conductivity type layer;
  (b) integrating etching current flowing through the semiconductor substrate; and
  (c) controlling the etching voltage on the basis of the integrated etching current to selectively etch the second conductivity type layer, such that the etching voltage is initially kept at a relatively lower voltage and increased to a relatively higher voltage after a predetermined time.

11. The method of claim 10 wherein the etching of the semiconductor substrate is completed when the etching current drops sharply.

* * * * *